(12) United States Patent
Mittelholzer et al.

(10) Patent No.: US 8,938,665 B2
(45) Date of Patent: *Jan. 20, 2015

(54) READ-DETECTION IN SOLID-STATE STORAGE DEVICES

(71) Applicant: International Business Machines Corporation, Armonk, NY (US)

(72) Inventors: Thomas Mittelholzer, Rueschlikon (CH); Nikolaos Papandreou, Rueschlikon (CH); Charalampos Pozidis, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 35 days.

This patent is subject to a terminal disclaimer.

(21) Appl. No.: 13/756,894

(22) Filed: Feb. 1, 2013

(65) Prior Publication Data

US 2013/0227380 A1   Aug. 29, 2013

(30) Foreign Application Priority Data

Feb. 29, 2012   (GB) .................................. 1203496.3

(51) Int. Cl.
*G06F 11/10* (2006.01)
*H03M 13/00* (2006.01)
*G11C 7/10* (2006.01)

(52) U.S. Cl.
CPC .......... *G06F 11/1004* (2013.01); *G11C 7/1006* (2013.01)
USPC ....................................................... 714/807

(58) Field of Classification Search
CPC ............ G06F 11/1004; G06F 11/1032; G06F 11/1072; G11C 7/1006; G11C 11/5678; G11C 2211/563; G11C 2211/5634; G11C 11/5621; G11C 11/5642; G11C 16/349; G11C 16/28; G11C 29/00; G11C 11/5671; G11C 16/10; G11C 16/0475

See application file for complete search history.

(56) References Cited

U.S. PATENT DOCUMENTS

| 2008/0263266 A1 | 10/2008 | Sharon et al. |
| 2011/0202711 A1 | 8/2011 | Yang et al. |
| 2011/0296274 A1 | 12/2011 | Mittelholzer et al. |
| 2013/0086457 A1* | 4/2013 | Mittelholzer et al. ........ 714/806 |
| 2013/0166994 A1* | 6/2013 | Mittelholzer et al. ........ 714/805 |

* cited by examiner

*Primary Examiner* — Guerrier Merant
(74) *Attorney, Agent, or Firm* — Cantor Colburn LLP

(57) ABSTRACT

A method for detecting codewords of a length-N, $q^{ary}$-symbol code, the symbols of each codeword stored in respective q-level cells of solid-state memory, where q>2, includes reading from memory cells storing a group of codewords to obtain respective read signals each comprising N signal components corresponding to respective symbols of a codeword. The signal components of the read signals are ordered according to signal level to produce an ordered component sequence. The ordered component sequence is partitioned to obtain segments corresponding to respective memory cell levels. Each segment contains a number of components dependent on predetermined frequency data indicative of expected frequency of occurrence of the corresponding level in use of the code. A reference signal level corresponding to each q memory cell level is determined in dependence on the signal components. The codeword corresponding to each read signal is then detected in dependence on the reference signal levels.

20 Claims, 4 Drawing Sheets (Actual levels after 120μs)

(Actual levels after 4 days)

(Estimated levels after drift – prior method)

(Estimated levels after drift – embodiment)

READ-DETECTION IN SOLID-STATE STORAGE DEVICES

PRIORITY

This application claims priority to Great Britain Patent Application No.: 1203496.3, filed Feb. 29, 2012, and all the benefits accruing therefrom under 35 U.S.C. §119, the contents of which in its entirety are herein incorporated by reference.

BACKGROUND

This invention relates generally to read-detection in solid-state storage devices (SSSDs), and more particularly to methods and apparatus for detecting codewords stored in multi-level memory cells on readout of solid-state memory.

In solid-state memory such as flash memory and phase change memory (PCM), the fundamental storage unit (the "cell") can be set to a number of different states, or "levels", which exhibit different electrical characteristics. These different levels can be used to store information. To readout stored information, cell-level is detected via measurements which exploit the differing electrical characteristics to differentiate between different levels. In so-called "single-level cell" (SLC) devices, the memory cells can be set to only two levels and so can record only binary values. Other devices have so-called "multi-level cells" which can be set to q different levels, where q>2. Multi-level NOR flash memories, for instance, can store 4 levels, i.e., 2 bits, per cell. Multi-level cell (MLC) NAND flash memory chips that can store 3 bits of data per single flash cell using 25 nm process technology are currently available. Storage of 2 bits per cell in PCM chips has also been demonstrated.

When writing information to multi-level cells, each cell can be used to store a $q^{ary}$ symbol with each of the q possible symbol values being represented by a different cell level. On readout of multi-level cells, the read signal level is compared with a set of reference signal levels indicative of the q cell-levels in order to determine which level each cell is set to and thus detect the stored symbol value. However, a problem in multi-level SSSDs is that the physical quantity measured during cell readout, such as electrical resistance in PCM devices, is liable to drift. In particular, the electrical resistance of PCM cells drifts upwards with time in a stochastic manner. This drift can be data-dependent, i.e., may vary for different cell levels. As another example, in flash memory cells the physical quantity measured is the transistor's threshold voltage and this drifts upwards as a function of the number of write/erase cycles the cell is subjected to. For any given stored symbol value and hence cell level, therefore, the actual read signal level obtained on cell-readout is variable.

Drift is a serious problem for multi-level storage in that it severely compromises reliability. The readback values of neighboring levels may interfere over time, due to upward drift of the lower level towards the upper level, causing detection errors. The closer the initial spacing between levels, the more susceptible they are to drift. Hence packing higher numbers of levels per memory cell becomes more difficult due to the increased likelihood of error during detection. On the other hand, packing more bits per cell is a crucial requirement for all memory technologies, being the best known way of reducing manufacturing cost per bit. Hence, in situations like this where the read signal level distributions for cell-levels are varying, the reference signal levels used for level detection need to be varied as well, e.g., with time, or with the number of write cycles, etc. Reliable estimation of the reference signal levels is crucial to reliable readback performance.

One approach to the above problem uses training data derived from a pool of reference memory cells for drift estimation. Known information is written to some of these reference cells each time a block of user data is written to memory. These reference cells are then read whenever the user file is read, and the reference cell readings are used to derive estimates for the changing reference signal levels used for detection of the user data. Use of a large amount of this training data significantly reduces storage capacity, while reducing the amount of training data reduces accuracy of level estimation. There is also a penalty in terms of controller complexity and latency due to readout of the extra cells, as well as issues, e.g., wear-leveling issues, related to management of the pool of reference cells. Further, since drift is a statistical phenomenon and there is significant variability between cells in a memory array, reference cells may not be representative and the effectiveness of this approach may vary substantially with time and over different portions of the memory array.

Model-based drift cancellation techniques provide another approach. These seek to model drift based on key parameters such as temperature, time and wear, and compensate accordingly. It is, however, difficult to obtain an accurate cell history for the key parameters. There are also fluctuations from cell to cell and there is no well-established analytical model available for short-term drift.

Our copending European Patent Application no. 11183336.4, filed 29 Sep. 2011, discloses a drift-resistant technique for read-detection of permutation-based codes in multi-level SSSDs. The codes in question are length-N, $q^{ary}$-symbol codes, whereby each codeword has N symbols and each symbol can take one of q symbol values. Each symbol is recorded in a respective q-level cell by setting the cell to a level dependent on the $q^{ary}$ symbol value. The detection system exploits the property of permutation-based codes that all codewords are permutations of a known set of N-symbol vectors, e.g., the so-called "initial vectors" for a union of permutation codes. Memory cells are read in batches to obtain read signals corresponding to a group of codewords. Each read signal has N signal components corresponding to respective symbols of a codeword, and these components are ordered according to signal level to obtain an ordered read signal for each codeword. Components of these ordered read signals are related to symbols of the known set of initial vectors via a process which involves averaging ordered read signals and relating the averaged signal components to symbol values using predefined probabilities of occurrence of different symbol values at different symbol positions as derived from the initial vectors. This reduces the problem of finding the q drifted reference signal levels to the problem of solving an over-determined system of N linear equations for the q unknown reference levels. In this way, estimates are obtained for the reference signal levels for the q-level cells in the current batch, and these reference levels are then used in codeword detection for the batch. Unlike the training-data approach, this is a self-adaptive technique which uses the actual cells storing encoded user data to estimate the reference levels for those cells on readback, thereby accounting for drift effects on a dynamic basis. The technique is also robust and lends itself to simple, fast decoder implementation. However, level-estimation performance can be variable with certain conditions, e.g., depending on the particular code employed, and small batch sizes in particular can adversely affect reliability, especially for "inner" levels of the series of q memory cell levels.

SUMMARY

In one embodiment, a method for detecting codewords of a length-N, $q^{ary}$-symbol code, the symbols of each codeword being stored in respective q-level cells of solid-state memory, where q>2, includes reading the memory cells storing a group of codewords to obtain respective read signals each comprising N signal components corresponding to respective symbols of a codeword; ordering the signal components of the group of read signals according to signal level to produce an ordered component sequence; partitioning the ordered component sequence to obtain segments corresponding to respective memory cell levels, each segment containing a number of components dependent on predetermined frequency data indicative of expected frequency of occurrence of the corresponding level in use of the code; determining a reference signal level corresponding to each of the q memory cell levels in dependence on the signal components in at least a plurality of the segments; and detecting the codeword corresponding to each read signal in dependence on the reference signal levels.

In another embodiment, an apparatus for detecting codewords of a length-N, qary-symbol code, the symbols of each codeword being stored in respective q-level cells of solid-state memory, where q>2, includes a memory controller configured to read the memory cells storing a group of codewords to obtain respective read signals each comprising N signal components corresponding to respective symbols of a codeword, and a codeword detector comprising control logic configured to: order the signal components of the group of read signals according to signal level to produce an ordered component sequence; partition the ordered component sequence to obtain segments corresponding to respective memory cell levels, each segment containing a number of components dependent on predetermined frequency data indicative of expected frequency of occurrence of the corresponding level in use of the code; determine a reference signal level corresponding to each of the q memory cell levels in dependence on the signal components in at least a plurality of the segments; and detect the codeword corresponding to each read signal in dependence on the reference signal levels.

BRIEF DESCRIPTION OF THE SEVERAL VIEWS OF THE DRAWINGS

Exemplary embodiments of the invention will now be described, by way of example, with reference to the accompanying drawings in which.

DETAILED DESCRIPTION

Figure 1:
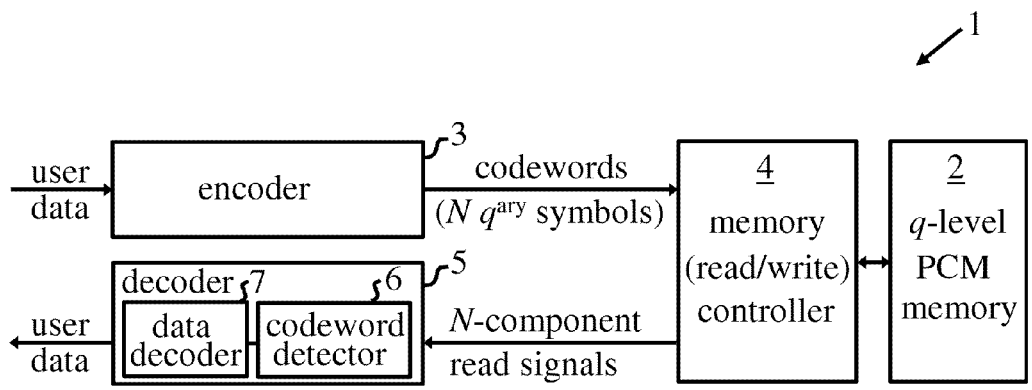
FIG. 1 is a schematic block diagram of a solid-state storage device embodying the invention.

One embodiment of the present invention provides a method for detecting codewords of a length-N, $q^{ary}$-symbol code, the symbols of each codeword being stored in respective q-level cells of solid-state memory, where q>2. The method includes: reading the memory cells storing a group of codewords to obtain respective read signals each comprising N signal components corresponding to respective symbols of a codeword; ordering the signal components of the group of read signals according to signal level to produce an ordered component sequence; partitioning the ordered component sequence to obtain segments corresponding to respective memory cell levels, each segment containing a number of components dependent on predetermined frequency data indicative of expected frequency of occurrence of the corresponding level in use of the code; determining a reference signal level corresponding to each of the q memory cell levels in dependence on the signal components in at least a plurality of the segments; and detecting the codeword corresponding to each read signal in dependence on the reference signal levels.

Read-detection methods embodying this invention provide for detection of codewords with N $q^{ary}$ symbols stored in respective q-level memory cells. A plurality of stored codewords are read at a time, and the resulting read signals for this group of codewords are processed to determine current reference signal levels for the q cell-levels. The set of reference signal levels derived from the group of codewords is then used in detection of those codewords Like the read-detection system of our aforementioned European patent application, the detection process is self-adaptive in that it uses actual "user cells" (the cells storing encoded user data) for reference level estimation and detection from those cells. However, an improved technique is employed for determining the current reference signal levels. This involves ordering the signal components of the group of read signals according to signal level, where the ordering is performed over the group of read signals as a whole. The resulting ordered component sequence is then partitioned to obtain a plurality of segments each corresponding to a different memory cell level. The size (i.e., number of components) of each of these segments is determined based on predetermined frequency data indicative of expected frequency of occurrence of the corresponding cell-level in use of the code. The signal components in at least a plurality of these segments can then be used to obtain the set of q current reference signal levels. This process thus provides for "blind" level estimation, obviating problems associated with data-aided estimation techniques such as the reference-cell and model-based approaches discussed above. In addition, methods embodying the invention provide highly reliable level estimation under a broad range of operating conditions. For example, the results obtained for inner cell levels and for small batch sizes (i.e., small groups of codewords) are substantially improved. This robustness to small batch size is particularly advantageous as it permits reliable operation with short data records as in main/hybrid memory applications. Methods embodying the invention are also amenable to simple, fast implementation and offer good detection performance for any length-N, $q^{ary}$-symbol code.

The N symbols of each codeword may comprise modulation-coded user data or simply user data expressed in a $q^{ary}$ alphabet and not otherwise subject to encoding. The overall code comprises the set of such codewords employed in operation of the system.

The ordered component sequence is produced by ordering the signal components of the group of read signals according to signal level, e.g., in order of increasing signal level, or alternatively decreasing signal level. The size of the segments, corresponding to different memory cell levels, obtained by partitioning this sequence depends on expected frequency of occurrence of those memory cell levels in use of the code. Appropriate frequency data, indicative of the expected level frequencies, can be defined for any given code based on the structure of the code (i.e., the particular codewords in the set) and the way in which the code is used, in particular the codeword probabilities (i.e., how likely each codeword is to be used). Such frequency data may be expressed, for instance, as an average number of occurrences of a given level in a stored codeword.

In exemplary embodiments, the ordered component sequence is partitioned into q segments each corresponding to a respective one of the q memory cell levels. In these embodiments, the reference signal level for each of the q memory cell levels can be determined based on the signal components in the corresponding segment, e.g., as the average, or median, of the components in that segment. In other embodiments, the reference signal levels for only a subset of the q memory cell levels (e.g., two or more "outer" cell levels) may be determined from the signal components in their corresponding segments. The reference signal level for each other memory cell level (e.g., one or more inner cell levels) may then be obtained by interpolation from the reference signal levels for the initial subset. In such cases, the ordered component sequence need not necessarily be partitioned into q segments. It may be sufficient, for example, to partition off segments corresponding to outer levels where inner levels are obtained by interpolation.

Various techniques can be envisaged for detecting the codewords in dependence on the reference signal levels derived for the codeword group. Exemplary embodiments derive statistical data for the level distributions of read signal components corresponding to each cell level. This statistical data is then used in the codeword detection process, using e.g., a MAP (maximum-a-posteriori) detection method or a ML (maximum-likelihood) detection method. Particularly exemplary embodiments perform an initial identification of the codeword to which each read signal corresponds, and use these initial results to obtain refined estimates for the reference signal levels, e.g., as part of the aforementioned statistical data. The new estimates can then be used for codeword detection in a second stage of the detection process.

An embodiment of a second aspect of the invention provides apparatus for detecting codewords of a length-N, $q^{ary}$-symbol code, the symbols of each codeword being stored in respective q-level cells of solid-state memory, where q>2. The apparatus comprises a memory controller for reading the memory cells storing a group of codewords to obtain respective read signals each comprising N signal components corresponding to respective symbols of a codeword, and a codeword detector comprising control logic adapted to: order the signal components of the group of read signals according to signal level to produce an ordered component sequence; partition the ordered component sequence to obtain segments corresponding to respective memory cell levels, each segment containing a number of components dependent on predetermined frequency data indicative of expected frequency of occurrence of the corresponding level in use of the code; determine a reference signal level corresponding to each of the q memory cell levels in dependence on the signal components in at least a plurality of the segments; and detect the codeword corresponding to each read signal in dependence on the reference signal levels.

In general, where features are described herein with reference to a method embodying the invention, corresponding features may be provided in apparatus embodying the invention, and vice versa.

FIG. 1 is a simplified schematic of a solid-state storage device, here a phase-change memory (PCM) device 1, embodying the invention. The device 1 includes phase-change memory 2 for storing data in one or more integrated arrays of multilevel PCM cells. Though shown as a single block in the figure, in general memory 2 may comprise any desired configuration of PCM storage units ranging, for example, from a single chip or die to a plurality of storage banks each containing multiple packages of storage chips. Device 1 includes an encoder 3 for encoding input data as discussed further below. A memory controller 4 controls writing of codewords in memory 2 and subsequent reading of memory cells to obtain read signals corresponding to codewords. A decoder 5 for processing the read signals comprises a codeword detector 6, which detects codewords corresponding to the received read signals, and a data decoder 7 which decodes the codewords to recover the original user data.

Each of the PCM cells in memory 2 can be set to one of q>2 nominal levels designated $l_1$ to $l_q$ herein. Read/write controller 4 can set a cell to a particular level by adjusting the resistance of the cell in known manner. To read a cell, controller 4 applies a small probing signal to obtain a readback signal indicative of the cell's resistance. During write and read operations, controller 4 addresses individual cells in known manner by applying appropriate voltage signals to an array of word and bit lines in memory ensemble 2.

In operation of device 1, the input user data to be recorded in memory 2 is supplied to encoder 3. The encoder 3 encodes the input data into codewords of a length-N, $q^{ary}$-symbol code, where in general N≥q. Hence, each codeword has N symbols $s_n$, n=1, 2, ..., N, and each symbol can take one of q possible values. Any length-N, $q^{ary}$ symbol code can be employed here. In general, the encoding process may involve modulation coding of input data or simple mapping of binary input data into $q^{ary}$ symbols without further encoding of the user data. The q possible symbol values correspond to respective predetermined levels $l_1$ to $l_q$ of the q-level cells in memory 2. Controller 4 stores the N symbols of each codeword output by encoder 3 in respective cells of memory 2 by setting each cell to a level dependent on the symbol value to be stored in accordance with the predefined correspondence between symbol values and cell levels. (Note that, when setting a cell to a given level, the actual resistance value x assumed by the cell may lie within a small interval around the nominal resistance value l for the level due to write noise).

Blocks of codewords are written/read substantially simultaneously to memory by memory controller 4. In this embodiment, controller 4 writes/reads groups of B codewords in parallel so that the codewords in each group are written/read at the same time instants. In a read operation, the memory cells storing a group of B codewords are read to obtain B real-valued read signals y each having N signal components $y_n$, n=1, 2, ..., N, indicating the read-back resistance values of the sequence of cells storing the N symbols of a codeword. The signal components $y_1, \ldots y_N$ of each read signal thus correspond to respective symbols of a codeword. The read signals y are supplied to decoder module 5 where codeword detector 6 detects the codeword corresponding to each read signal by a process detailed below. Data decoder 7 then decodes the detected codewords by performing the inverse of the encoding performed in encoder 3, thus recovering the original input data.

In general, functionality of encoder 3 and decoder 5 could be implemented in hardware, software or a combination thereof. For example, the mapping of input data words into codewords in encoder 3 may be implemented using a look-up table, in particular for small codes, or using the well-known technique of enumerative source coding for more efficient operation with large codes. Data decoder 7 can be implemented in corresponding manner to perform the inverse of the coding process. The codeword detector 6 comprises control logic for implementing the various steps of the codeword detection process detailed below, and this control logic can be embodied in hardware or software or a combination of hardware and software components. Though the detection processes will be described in terms of a series of separate steps, functionality associated with different steps may be provided by a single component of the control logic, and a plurality of components may be involved in performance of any particular step. For example, one or more of the steps could be performed in whole or in part by software which configures a processor to implement the functionality described, and suitable software will be readily apparent to those skilled in the art. For reasons of operating speed, however, the use of hardwired logic circuits is generally preferred to implement detector functionality as far as possible. Again, suitable implementations will be readily apparent from the description of operation herein.

In read operations from memory 2, the read-back resistance levels corresponding to respective symbol values of the stored codewords are variable due to drift and noise effects. Drift is of stochastic nature and is modeled here (for each cell) in accordance with the general drift model in which, if:

t is a time parameter (logarithmic time scale);

the initially written and read-back signal at time $t_0$ is a random variable $X=X(t_0)$ taking on q values;

systematic drift is modeled by an order-preserving function $f_t(x)$ in the levels x (i.e., the q different memory cell levels maintain their order over time) and monotonically increasing in t for $t \geq t_0$;

zero-mean (Gaussian) data-dependent noise at time t is denoted by: $W(x,t)$;

then the readback signal from a single cell at time t is denoted by $$Y(t)=f_t(X)+W(X,t).$$

Hence, the readback resistance level distributions shift in time, with changing means and potentially variances, and are level-dependent, having data-dependent means and variances. For accurate detection of codewords from the codeword read signals y, the codeword detector 6 must account for the variable resistance level distributions. Most fundamentally, in order to correlate read signal components $y_n$ with symbol values $s_n$, the codeword detector must estimate appropriate reference signal levels which correspond to the different cell levels $l_1$ to $l_q$, and hence to the different symbol values, for the read operation. These estimated reference signal levels can then be used for codeword detection. An overview of the codeword detection process is given below with reference to the flow diagram of FIG. 2.

Figure 2:
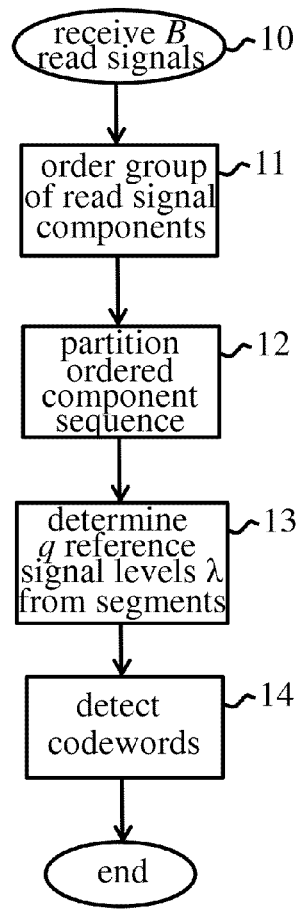
FIG. 2 indicates key steps in operation of a codeword detector in the FIG. 1 device.

FIG. 2 indicates the main operational steps performed by codeword detector 6. As indicated at step 10, detector operation commences on receipt of a group of B read signals $y^{(b)}$, b=1, ..., B, from memory controller 4 corresponding to a group of B codewords read from memory 2. The read signals $y^{(b)}$ are temporarily stored in codeword detector 6 for use in the subsequent processing operation. Together, the B read signals form a concatenated word $y^B=[y^{(1)}, y^{(2)}, \ldots, y^{(B)}]$ with B×N read signal components corresponding to the B×N stored codeword symbols. Next, in step 11, the control logic of detector 6 orders the B×N components of the concatenated word $y^B$ according to signal level. In particular, the read signal components are ordered in order of increasing signal level to produce an ordered component sequence $y^s=[y_1^s, y_2^s, \ldots y_{BN}^s]$. Next, in step 12, the detector logic partitions the ordered component sequence $y^s$ into q consecutive segments $S_j$, j=1 to q, each corresponding to a respective one of the q memory cell levels. The number of components in each segment $S_j$ depends on predetermined frequency data indicative of expected frequency of occurrence of the corresponding memory cell level in use of the code. This is explained in more detail below. In step 13, the detector logic determines a current reference signal level for each of the q memory cell levels in dependence on the signal components in the corresponding segment. In particular, for the q nominal cell levels $l_1$ to $l_q$ at time t=0, the corresponding drifted levels for the current batch of codewords are denoted by $\lambda_1$ to $\lambda_q$. These current reference signal levels $\lambda_1$ to $\lambda_q$ are calculated in detector 6 via a process detailed below. The codeword detector then uses the current reference signal levels $\lambda_1$ to $\lambda_q$ in step 14 to detect the codewords corresponding to the current group of read signals $y^{(b)}$, b=1, ..., B. This can be done in various ways and particular examples will be described below. The codeword detection operation is then complete.

The operation of steps 12 and 13 of FIG. 2 will now be considered in more detail. As indicated above, the size of the segments into which the ordered component sequence is partitioned in step 12 depends on expected frequency of occurrence of the q memory cell levels in use of the code. Appropriate frequency data, indicative of the expected level frequencies, can be defined for any given code based on the structure of the code $C \subseteq \{0, 1, \ldots, q-1\}^N$ and how likely each codeword is to appear (e.g., expressed in terms of codeword probabilities) in use of the code. In some systems, for example, all codewords may be equally likely. In others, some codewords may occur more frequently than others. In any case, given defined codeword probabilities and the known code structure, the expected frequency of occurrence of a given level can be calculated. In this example, assuming that the stored codeword signals written and read at time $t_0$ have components $[x_1, \ldots, x_N]$, the frequency data is calculated as the average frequency $f_j$ of each nominal cell level $l_j$ via:

$$f_j = E[\Sigma_{k=1 \ldots N} \delta(X_k, l_j)] j=1, 2, \ldots, q$$

where: the expectation function E[.] is with respect to the codeword probability distribution;

$X_k$ is a random variable representing a stored codeword component $x_1$ to $x_N$; and $\delta$ represents the Kronecker delta such that $\delta=1$ if $X_k=l_j$ and $\delta=0$ otherwise.

The frequency data $f_j$ for each level $l_j$ thus indicates the expected average value (over all codewords and accounting for the codeword probabilities) for the number of occurrences of that level in a stored codeword signal at time $t_0$.

For a batch of B randomly selected codewords $x^{(b)}$, b=1, ..., B, assume that the components of the concatenated word $x^B=[x^{(1)}, x^{(2)}, \ldots, x^{(B)}]$ are ordered according to increasing signal level to obtain the ordered component sequence $x^s$ of length B×N. This range 1, 2, ..., B×N can then be partitioned into q consecutive segments $s_j$ of size about $f_jB$ (i.e., the segment size is as close as possible to $f_jB$ subject to rounding to integer values). If the components $x^s$ are then averaged over each segment $s_j$, one obtains an approximation of the q corresponding levels $l_j$.

In the read-detection process of FIG. 2, the original nominal levels have drifted over time and the levels at time t are given by $\lambda_j=f_t(l_j)$, j=1, ..., q. By assumption, however, drift maintains the ordering of the levels and so the drifted levels can be estimated from a batch of B readback codewords $y^{(b)}$, b=1, ..., B, following the procedure given above for the corresponding codewords $x^{(b)}$ before drift. Thus, in step 12 of FIG. 2 the ordered component sequence $y^s=[y_1^s, y_2^s, \ldots y_{BN}^s]$ is partitioned into q consecutive segments $S_j$ of size $f_jB$ (subject to rounding to integer values). In step 13 of FIG. 2, the drifted levels $\lambda_1, \lambda_2, \ldots, \lambda_q$ are estimated by averaging the signal components in the corresponding segment $S_j$:

$$\lambda_j = (1/|S_j|) \Sigma_{k \in S_j} y_k^s.$$

Detection of codewords based on the current reference signal levels $\lambda_1$ to $\lambda_q$ can be performed in a variety of ways. In a simplistic implementation, for example, the reference levels $\lambda_0$ to $\lambda_q$ could be used directly for codeword detection by comparing the components $y_n$ of each read signal $y$ with these levels to identify the particular cell level, and hence symbol value, to which each read signal component corresponds. However, exemplary embodiments offer improved detection accuracy and perform at least one stage of codeword detection using a minimum distance decoding process such as MAP or ML decoding. Particular examples are described in the following.

Figures 3, 4:
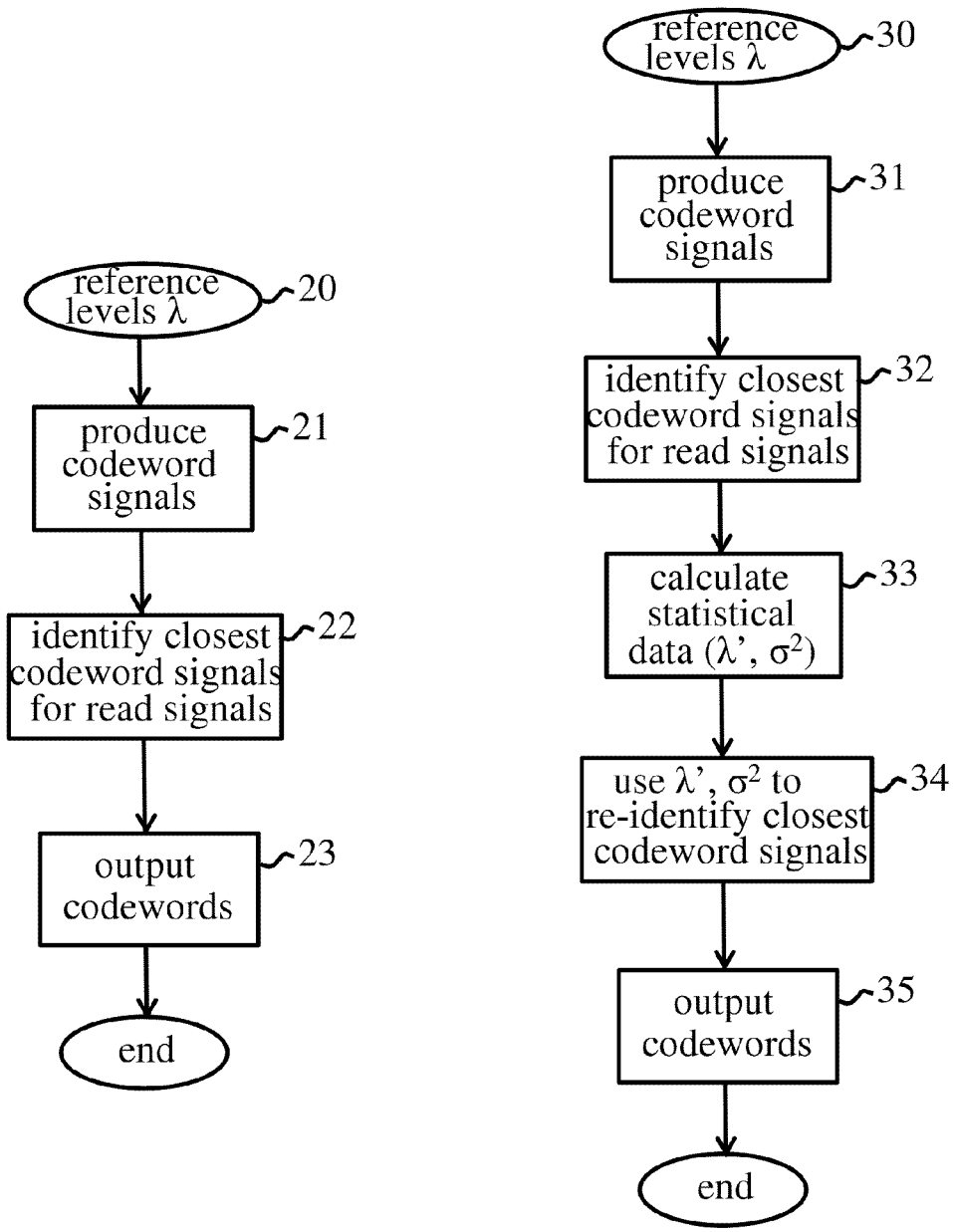
FIG. 3 indicates steps of a first codeword detection method which can be performed by the FIG. 1 device.
FIG. 4 indicates steps of an exemplary codeword detection method in the FIG. 1 device.

FIG. 3 shows the main steps in a first codeword detection process which may be performed by codeword detector 6. The operation commences at step 20 with determination of the current reference signal levels $\lambda_1$ to $\lambda_q$ as already described. Next, in step 21, the detector produces a codeword signal corresponding to each possible codeword by replacing each symbol of the codeword by the reference signal level $\lambda_j$ for the memory cell level corresponding to the symbol value. Thus, each codeword is effectively mapped to its counterpart at time $t$ with real physical quantities (the reference signal levels $\lambda_j = f_t(l_j)$,) as components. Next, in step 22, the codeword detector identifies the codeword signal which is closest to each read signal based on some minimum distance criterion. Any convenient minimum distance criterion, e.g., a simple Euclidean distance metric, can be employed in this step as desired. The codeword corresponding to the codeword signal so identified for each read signal is then output by codeword detector 6 in step 23. (Note that, if some operational error results in detection of an invalid codeword here then detector 6 simply outputs an erasure symbol for that codeword. This can be addressed by suitable error-correction processing in data decoder 7. Such processes are well known to those skilled in the art and need not be addressed here). The codeword detection process is then complete.

Depending on desired accuracy and latency constraints, a more sophisticated detection process can be employed involving a further stage of codeword detection based on statistical data derived for the level distributions. The main steps of such a process are indicated in FIG. 4. The operation commences at step 30 with determination of the current reference signal levels $\lambda_1$ to $\lambda_q$ as before. Steps 31 and 32 of the process are identical to steps 21 and 22 of FIG. 3, whereby detector 6 identifies the closest codeword signal for each read signal. In step 33, the detector logic calculates statistical data for the distribution of the read signal components corresponding to each of the q nominal levels of the memory cells. In particular, by correlating the read signal components with the q reference signal levels $\lambda_1$ to $\lambda_q$ in the codeword signals, the read signal level distributions for each of the q cell-levels are obtained. In effect, the B×N components of the group of B read signals are divided into q clusters, each cluster containing components corresponding to a different level $\lambda_1$ to $\lambda_q$. The first and second order statistics for each level are then determined from the level distributions (clusters) so obtained. In particular, the distributions are processed to obtain the mean and variance in each case. The mean values so obtained for the q cell-levels are denoted by $\lambda'_1$ to $\lambda'_q$ and represent updated values for the reference signal levels $\lambda$ used in the initial detection stage of steps 31 and 32. The variance for each level distribution is denoted by $\sigma^2$. The statistical data is then used in a second stage of the codeword detection process. Specifically, in step 34 of FIG. 4, the detector logic uses the means $\lambda'$ and variances $\sigma^2$ in a second pass of the FIG. 3 process. Hence, the closest codeword signal to each read signal is again identified, this time using the updated values $\lambda'$ in the codeword signals and the variances $\sigma^2$ for the level distributions. This process is preferably based on one of a maximum-a-posteriori (MAP) detection method and a maximum-likelihood (ML) detection method, such methods being well known to those skilled in the art. The MAP/ML method used here may depend on the particular code employed and a particular example is given below. Finally, in step 35, the detector outputs the detected codeword (or an erasure symbol) as in step 23 of FIG. 3, and the process is complete.

The process of FIG. 4 can be viewed as a two-stage clustering method in which the first stage (step 30) provides the first reference level estimates $\lambda$. These are used as initialization values for the clustering step which provides the final estimates $\lambda'$, $\sigma^2$. The first stage provides a well-defined initialization step which guarantees reliable convergence. This is a significant improvement over clustering techniques such as k-means clustering and expectation maximization which generally need several iterations to converge to a good solution, adding to latency, and are liable to converge to erroneous solutions (local minima) unless properly initialized. The FIG. 4 technique is guaranteed to be robust to initial conditions, and is also fast, converging to the final solution in two iterations. In addition, the process is independent of underlying drift characteristics, making no assumptions about drift except for monotonicity (i.e., the levels maintain their order over time).

If latency is critical, an alternative to the FIG. 4 process could employ statistical data calculated directly from the segments of the ordered component sequence produced in step 12 of FIG. 2. In particular, the read signal components in each segment of the ordered sequence can be taken as defining the signal level distribution for the corresponding memory cell level. The mean values $\lambda$ and variances $\sigma^2$ calculated from these distributions can then be used as the basis for the MAP/ML detection of step 34 in FIG. 4.

The techniques described above can be used for detection of any length-N, $q^{ary}$-symbol code. Some embodiments of device 1 may use a permutation-based code. In this case, the detection process of FIGS. 3 and 4 could be modified to exploit the permutation property of the code similarly to techniques in our European Application no. 11183336.4 mentioned earlier. An exemplary code here is a union of L permutation codes defined by the known set of L initial vectors $c^{(1)}, c^{(2)}, \ldots, c^{(L)}$, each of length N, whose symbols are ordered in order of increasing symbol value. Every codeword in the code is therefore a permutation of one of these initial vectors. A modification of the detection process of FIG. 3 for this code is illustrated in FIG. 5.

Figure 5:
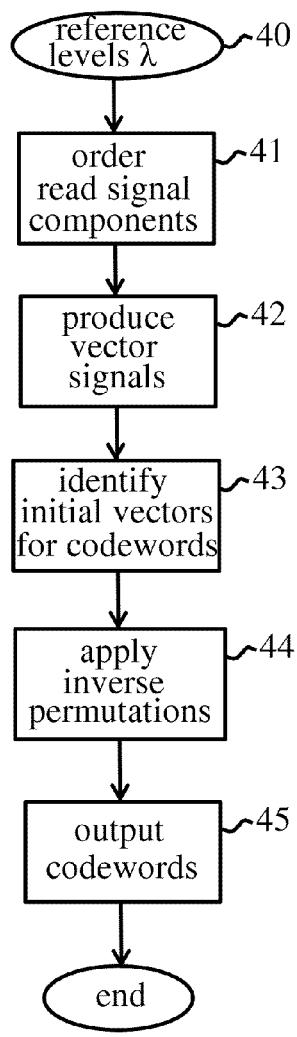
FIG. 5 indicates steps of an alternative codeword detection method for permutation-based codes.

The FIG. 5 operation commences at step 40 with determination of the current reference signal levels $\lambda_1$ to $\lambda_q$ as in FIG. 2. In step 41, detector 6 orders the components $y_1$ to $y_N$ of each read signal $y$ according to signal level. In particular, the read signal components are ordered in order of increasing signal level (reflecting the symbol order of the initial vectors), to produce a group of B ordered read signals $z^i$:

$$z^i = [y_{k_1}^i, y_{k_2}^i, \ldots, y_{k_N}^i], \; y_{k_1}^i \leq y_{k_2}^i \leq \ldots \leq y_{k_N}^i, \text{ where } i=1, \ldots, B$$

This ordering process defines a permutation $(k_1 \text{ to } k_N)$ of the signal components for each read signal $y$. The resulting ordered read signals, and their associated permutations, are stored in codeword detector 6. Next, in step 42, the detector produces a vector signal corresponding to each initial vector by replacing each symbol of the vector by the reference signal level λ corresponding to the symbol value. That is, each initial vector is mapped to its counterpart at time t with real physical quantities (the reference signal levels λ) as components. The resulting vector signals are then used to divide the group of B ordered read signals $z^i$ from step 41 into clusters corresponding to respective initial vectors. Specifically, in step 43 of FIG. 5, the initial vector of which the codeword corresponding to each ordered read signal $z^i$ is a permutation is identified by determining which vector signal is closest to that ordered read signal. Again, the minimum can be assessed here using any convenient minimum distance criterion such as a simple Euclidean distance metric. Having effectively assigned each ordered read signal $z^i$ (and hence corresponding read signal y) to a cluster according to the initial vector identified in step 43, in step 44 the detector logic can detect the codeword corresponding to each read signal by applying an inverse permutation to the initial vector identified for the read signal. For a given read signal, the inverse permutation is simply the inverse of the permutation ($k_1$ to $k_N$) of that read signal which produced the ordered read signal in step 41. The resulting codeword for each of the group of B read signals is then output by codeword detector 6 in step 45 and the process is complete.

The two stage detection process of FIG. 4 could be similarly modified for permutation-based codes. The statistical data for the level distributions could be calculated in step 33 from the clustered ordered read signals, and a similar process of clustering ordered read signals about initial vectors, and inverse permutation, could be used in the second stage of codeword detection.

An exemplary detection process is discussed in the following for a code which is based on single-parity-checks (SPC). Such SPC-based codes are discussed in detail in our copending European Patent Application No. 11194950.9, filed 21 Dec. 2011, in the context of permutation-based decoding. As discussed in that application, SPC-based codes offer high code-rates with good minimum distance. In addition, these codes offer a simple mapping of input data to codewords and simple encoder construction. Such codes are thus advantageous for use in device 1 and can be detected via a process described above. As an example here, we consider a code of length N=5 using q=4 cell-levels 0, 1, 2, 3 with binary labeling 0⇔00, 1⇔01, 2⇔10, 3⇔11 defining the $4^{ary}$ symbol values for the code. The code has a two-level construction with the first and second code levels corresponding to the most-significant bit (MSB) and least significant bit (LSB) respectively of the 2-bit symbols defined by the labeling scheme. A single-parity-check constraint is imposed on the second code level, i.e., the LSBs. No constraint is imposed on the first code level (MSBs). The codeword construction for the code is given by $(c'_1 c''_1, c'_2 c''_2, \ldots, c'_5 c''_t)$ where:

five uncoded data bits form the five most-significant bits $c'_1$ to $c'_5$ of the first code level;

four uncoded data bits form the first four bits $c''_1$ to $c''_4$ of the second code level; and $c''_5$ is the parity bit calculated such that $c''_1 + c''_2, \ldots c''_5 = 0$ (mod 2).

This code can be implemented in encoder 3 via a simple linear encoding process. This code has a rate of 9/5=1.8 bits/cell and a minimum squared Euclidean distance $d^2_{min} = 2 \times d^2(0,1)$. There is a 3 dB asymptotic gain in exchange for a slight loss in rate from 2 to 1.8 bit/cell.

Figure 6:
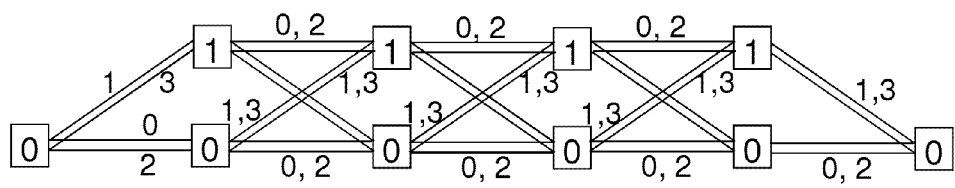
FIG. 6 shows a trellis diagram for use in an exemplary implementation of the FIG. 4 method.

The above SPC-based code can be efficiently decoded via the detection process of FIG. 4. Thus, estimates for the drifted levels $\lambda_j$ can be obtained using the FIG. 2 technique. The minimum distance decoding performed in step 32 of FIG. 4 is implemented here via trellis decoding. Trellis decoding is well known in the art and need not be described in detail here. This decoding process is implemented via the two-state trellis shown in FIG. 6 based on the initial reference level estimates $\lambda_j$. The statistical data $\lambda'_j$, $\sigma_j^2$ is then calculated from the drifted level distributions as described in step 33 of FIG. 4. Next, ML decoding in step 34 is implemented by trellis decoding with data-dependent branch metric: $-\ln p(y|\lambda_j) \sim \ln \sigma_j^2 + (y - \lambda'_j)^2 / \sigma_j^2$, j=1 to q. The metrics of the two-state trellis of FIG. 6 are thus determined based on the means and variances for the levels. Trellis decoding with the data-dependent branch metric is then performed for each read signal y in the batch B.

As an alternative to trellis decoding, the SPC-based code can also be decoded using permutation-based detection as discussed above. In particular, consideration of this and similar codes based on single-parity-checks shows that these codes are invariant under permutation of their arguments, the parity condition being satisfied for all permutations of the symbol set $(c_1, c_2, \ldots, c_N)$. It follows that all codewords of such a code are permutations of an identifiable subset of the codewords. This subset constitutes a set of N-symbol vectors for the code such that each possible codeword is a permutation of one vector in the set. Hence, these codes can be viewed as a union of permutation codes, and can be decoded using permutation-based techniques, involving clustering of ordered read signals around vectors and inverse permutation, as described in connection with FIG. 5.

Figure 7A:
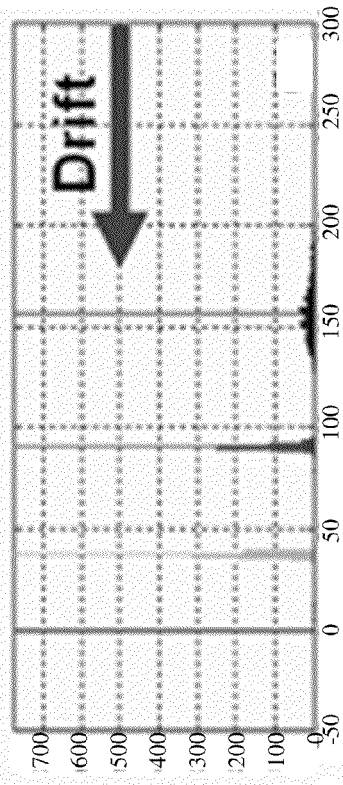
FIGS. 7a to 7d show histograms which indicate cell-levels after drift and compare actual measurements with estimates using both a prior technique and a method embodying the invention.
Figure 7B:
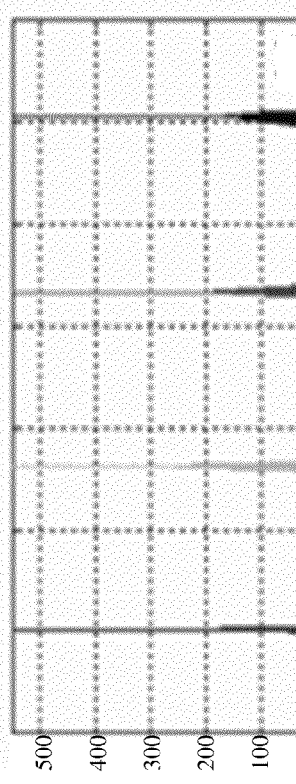
Figure 7C:
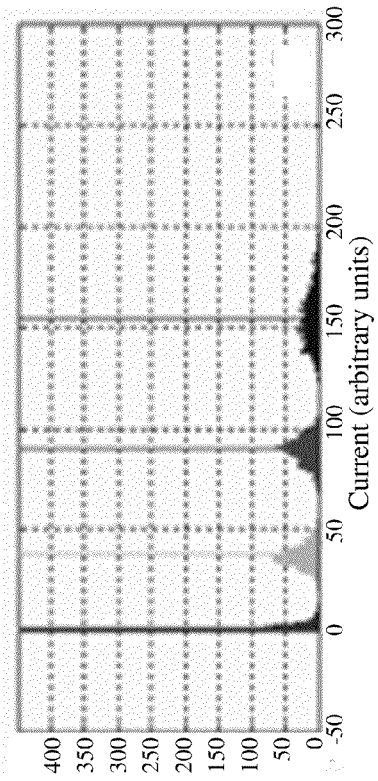
Figure 7D:
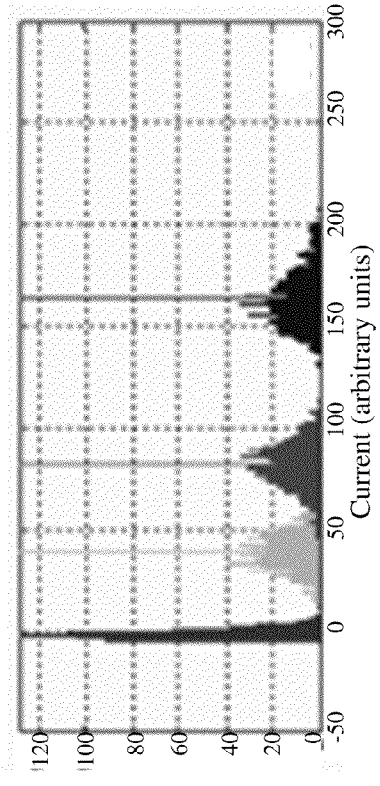

FIGS. 7a and 7b show histograms of measured readback currents from a PCM array with 200,000 cells that have been programmed with q=4 levels. FIG. 7a shows the actual current-level distributions 120 μs after programming, and FIG. 7b shows the actual current-level distributions 4 days after programming. Readback current (at constant voltage) is used as a metric for cell resistance here. From Ohm's law, if cell resistance tends to increase over time then cell readback current tends to decrease over time. Hence, drift trends to decrease the measured current as indicated by the arrow in FIG. 7b. The underlying code is a two-level SPC-based code of length N=8, which is determined by a single parity check on the least significant bits of the codeword symbols resulting in a rate of 1.875 bit/cell. Using a batch size of 32 codewords, which corresponds to blocks of 256 cells, the drifted levels (after 4 days) were estimated using the prior level-estimation technique of our EP application no. 11183336.4 and the level estimation technique described herein with reference to FIG. 2. FIG. 7c shows the results for the prior technique and FIG. 7d shows the results for the FIG. 2 technique. Comparison of these figures clearly demonstrates the excellent performance of the FIG. 2 technique, even with the small batch size used here, and an improvement in performance over the prior technique. The improvement is particularly apparent for the two inner cell levels, where the results can be seen to merge with the prior technique in FIG. 7c.

It will be seen from the foregoing that detection techniques embodying the invention provide significant improvements in multilevel solid-state storage devices. Problems associated with prior data-aided techniques are avoided. The detection techniques can be applied with any length-N, $q^{ary}$-symbol code, are amenable to simple, fast implementation, and offer improved performance compared to prior systems, providing particularly good performance for small batch sizes B.

It will of course be appreciated that many changes and modifications can be made to the particular embodiments detailed above. One particularly useful modification to the estimation technique of FIG. 2 can provide improved results where estimation of the reference signal levels for some of the q cell levels is less reliable than for others. In resistance histograms like those of FIGS. 7c and 7d, for instance, the estimation results for the two inner levels may be less well defined than those for the two outer levels. In most scenarios of practical interest, the Simplified Systematic Drift Model holds where the equation for average drift (systematic drift) at time t is given by $R(t)=R_0(t/t_0)^v$, where the drift exponent v depends on the initial resistance value $R_0$ via $v=\alpha \log R_0 + b$. In the log domain $$\log R(t) = v \log(t/t_0) + \log R_0 = \log R_0(1+\alpha \log(t/t_0)) + b \log(t/t_p)$$

And $$y = x(1+\alpha \tau) + b\tau$$

where $x = \log R_0$, $y = \log R(t)$ and $\tau = \log(t/t_0)$. Based on this equation, missing or unreliable drifted levels $y_m$ can be obtained by linear interpolation from two "known", or more reliable, levels $y_0$, $y_1$. In a modification to step 13 of FIG. 2, therefore, the reference signal level λ for each of a plurality p (being a subset) of the q memory cell levels can be obtained as described earlier in dependence on the signal components in the corresponding segment. However, the reference signal level for the remaining q-p memory cell level(s) can be obtained by interpolation from reference signal levels λ determined for the initial p cell levels. This technique may be applied to interpolate estimates for inner levels from outer levels, or more generally any less reliable level from more reliable levels. We further note here that the interpolation of levels as described above can also be applied to particular advantage with the reference level estimation technique of our prior EP application no. 11183336.4. Hence, reference level estimates for outer (or more reliable) levels can be obtained as described in that application (the relevant content of which is incorporated herein by reference) by a process which involves averaging ordered read signals and relating the average components to symbol values using predefined probabilities of occurrence of different symbol values at different symbol positions as derived from the initial vectors. However, only the outer (or more reliable) level estimates derived by this process are retained. The remaining level estimates are then obtained by interpolation from reliable level estimates as described above.

In some embodiments of the present invention, e.g., where interpolation is used to estimate inner levels from outer levels, it may not be necessary to partition the ordered component sequence completely into q segments. It may be sufficient, for example, to partition off segments corresponding to the outer levels where the inner levels are to be obtained by interpolation.

Other ways for calculating the reference signal levels from the segment components can also be envisaged. For example, instead of calculating the mean value as above, the median of the signal components in a segment may be selected as the reference signal level for the corresponding memory cell level. Here, since the segments $S_j$ are already sorted, the reference level is simply obtained as the middle component of each segment, i.e., if the segment has $s_j$ elements, the median is the $(s_j/2)$-th element. Other functions, e.g., a weighted average or accommodating some desired correction factor, might possibly be envisaged here.

While memory 2 uses PCM cells, the techniques described can of course be applied to other multilevel solid state memory cells, such as flash memory cells, where similar considerations apply. Many other changes and modifications can be made to the above embodiments without departing from the scope of the invention.

The invention claimed is:

1. A method for detecting codewords of a length-N, $q^{ary}$-symbol code, the symbols of each codeword being stored in respective q-level cells of solid-state memory, where q>2, the method comprising:
   reading the memory cells storing a group of codewords to obtain respective read signals each comprising N signal components corresponding to respective symbols of a codeword;
   ordering the signal components of the group of read signals according to signal level to produce an ordered component sequence;
   partitioning the ordered component sequence to obtain segments corresponding to respective memory cell levels, each segment containing a number of components dependent on predetermined frequency data indicative of expected frequency of occurrence of the corresponding level in use of the code;
   determining a reference signal level corresponding to each of the q memory cell levels in dependence on the signal components in at least a plurality of the segments; and
   detecting the codeword corresponding to each read signal in dependence on the reference signal levels.

2. The method as claimed in claim 1, further comprising including partitioning the ordered component sequence into q the segments corresponding to respective memory cell levels.

3. The method as claimed in claim 2, further comprising determining the reference signal level for each of the q memory cell levels in dependence on the signal components in the corresponding segment.

4. The method as claimed in claim 1, further comprising:
   determining the reference signal level for each of a plurality the q memory cell levels in dependence on the signal components in the corresponding segment; and
   determining the reference signal level for each other memory cell level by interpolation from reference signal levels determined for the plurality of memory cell levels.

5. The method as claimed in claim 3, further comprising averaging the signal components in the corresponding segment to determine the reference signal level for the memory cell level corresponding to that segment.

6. The method as claimed in claim 3, further comprising selecting the median of the signal components in the corresponding segment to determine the reference signal level for the memory cell level corresponding to that segment.

7. The method as claimed in claim 1 wherein detecting the codeword corresponding to each read signal further comprises:
   producing a codeword signal corresponding to each codeword of the code by replacing each symbol of the codeword by the reference signal level for the memory cell level corresponding to the value of that symbol; and
   identifying the codeword signal which is closest to each read signal.

8. The method as claimed in claim 7, further comprising:
   calculating statistical data for the distribution of the read signal components corresponding to each of the q memory cell levels from the read signals and the codeword signals identified therefor; and
   detecting the codeword corresponding to each read signal in dependence on the statistical data.

9. The method as claimed in claim 2, further comprising:
calculating statistical data for the distribution of the read signal components corresponding to each of the q memory cell levels from the signal components in the segment corresponding to that memory cell level; and
detecting the codeword corresponding to each read signal in dependence on the statistical data.

10. The method as claimed in claim 8, further comprising detecting the codewords in dependence on the statistical data using one of a maximum-a-posteriori detection method and a maximum-likelihood detection method.

11. The method as claimed in claim 10, further comprising detecting the codewords by trellis decoding using the statistical data.

12. The method as claimed in claim 1 wherein each of the codewords of the code is a permutation of an N-symbol vector of a predetermined set of N-symbol vectors whose symbols are ordered according to symbol value, and wherein the step of detecting the codeword corresponding to each read signal includes:
ordering the components of each read signal according to signal level produce an ordered read signal;
producing a vector signal corresponding to each the vector by replacing each symbol of the vector by the reference signal level for the memory cell level corresponding to the value of that symbol; and
identifying the vector of which each codeword in the group is a permutation by determining which vector signal is closest to the ordered read signal for that codeword.

13. The method as claimed in claim 1 wherein the group of codewords are read substantially simultaneously.

14. The method as claimed in claim 1 wherein the group of codewords comprises codewords written substantially simultaneously to the solid state memory.

15. An apparatus for detecting codewords of a length-N, qary-symbol code, the symbols of each codeword being stored in respective q-level cells of solid-state memory, where q>2, comprising:
a memory controller configured to read the memory cells storing a group of codewords to obtain respective read signals each comprising N signal components corresponding to respective symbols of a codeword, and a codeword detector comprising control logic configured to:
order the signal components of the group of read signals according to signal level to produce an ordered component sequence;
partition the ordered component sequence to obtain segments corresponding to respective memory cell levels, each segment containing a number of components dependent on predetermined frequency data indicative of expected frequency of occurrence of the corresponding level in use of the code;
determine a reference signal level corresponding to each of the q memory cell levels in dependence on the signal components in at least a plurality of the segments; and
detect the codeword corresponding to each read signal in dependence on the reference signal levels.

16. The apparatus as claimed in claim 15, wherein the control logic is further configured to partition the ordered component sequence into q the segments corresponding to respective memory cell levels.

17. The apparatus as claimed in claim 16, wherein the control logic is further configured to determine the reference signal level for each of the q memory cell levels in dependence on the signal components in the corresponding segment.

18. The apparatus as claimed in claim 15, wherein the control logic is further configured to:
determine the reference signal level for each of a plurality the q memory cell levels in dependence on the signal components in the corresponding segment; and
determine the reference signal level for each other memory cell level by interpolation from reference signal levels determined for the plurality of memory cell levels.

19. The apparatus as claimed in claim 17, wherein the control logic is further configured to average the signal components in the corresponding segment to determine the reference signal level for the memory cell level corresponding to that segment.

20. The apparatus as claimed in claim 17, wherein the control logic is further configured to select the median of the signal components in the corresponding segment to determine the reference signal level for the memory cell level corresponding to that segment.

* * * * *